(12) United States Patent
Juengling

(10) Patent No.: US 6,898,779 B2
(45) Date of Patent: May 24, 2005

(54) PATTERN GENERATION ON A SEMICONDUCTOR SURFACE

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 242 days.

(21) Appl. No.: 10/232,853

(22) Filed: Aug. 28, 2002

(65) Prior Publication Data

US 2004/0044978 A1 Mar. 4, 2004

(51) Int. Cl.⁷ .......................... G06F 17/50; G06F 19/00; G06K 9/46; G21K 5/00
(52) U.S. Cl. ................ 716/21; 716/10; 430/5; 378/35; 382/144; 250/492.2; 700/120; 700/121
(58) Field of Search .................. 716/21, 10; 430/5; 378/35; 700/120, 121; 382/144; 250/492.2

(56) References Cited

U.S. PATENT DOCUMENTS

| | | | |
|---|---|---|---|
| 4,871,688 A | 10/1989 | Lowrey | 437/47 |
| 4,957,878 A | 9/1990 | Lowrey et al. | 437/52 |
| 5,087,951 A | 2/1992 | Chance et al. | 357/23.6 |
| 5,223,083 A | 6/1993 | Cathay et al. | 156/643 |
| 5,358,601 A | 10/1994 | Cathey | 438/721 |
| 5,625,568 A * | 4/1997 | Edwards et al. | 716/2 |
| 5,674,785 A | 10/1997 | Akram et al. | 437/217 |
| 5,733,711 A | 3/1998 | Juengling | 430/312 |
| 5,739,585 A | 4/1998 | Akram et al. | 257/698 |
| 5,808,360 A | 9/1998 | Akram | 257/738 |
| 5,821,014 A * | 10/1998 | Chen et al. | 430/5 |
| 5,834,366 A | 11/1998 | Akram | 438/614 |
| 5,840,598 A | 11/1998 | Grigg et al. | |
| 5,871,870 A | 2/1999 | Alwan | |
| 5,885,734 A | 3/1999 | Pierrat et al. | 716/19 |
| 5,925,410 A | 7/1999 | Akram et al. | 427/240 |
| 5,959,347 A | 9/1999 | Grigg et al. | |
| 5,965,940 A | 10/1999 | Juengling | 257/752 |
| 5,976,964 A | 11/1999 | Ball | 438/613 |
| 5,981,384 A | 11/1999 | Juengling | 438/666 |
| 6,008,070 A | 12/1999 | Farnworth | 438/114 |
| 6,013,948 A | 1/2000 | Akram et al. | 257/698 |
| 6,030,731 A | 2/2000 | Yang | 430/5 |
| 6,034,440 A | 3/2000 | Ball | |
| 6,063,650 A | 5/2000 | King et al. | |
| 6,083,767 A | 7/2000 | Tjaden et al. | 438/20 |
| 6,093,655 A | 7/2000 | Donohoe et al. | 438/717 |
| 6,121,070 A | 9/2000 | Akram | |
| 6,143,580 A | 11/2000 | Wells et al. | 438/20 |
| 6,165,887 A | 12/2000 | Ball | 438/613 |
| 6,184,064 B1 | 2/2001 | Jiang et al. | 438/113 |
| 6,206,754 B1 | 3/2001 | Moore | 451/8 |
| 6,213,845 B1 | 4/2001 | Elledge | 451/6 |
| 6,234,878 B1 | 5/2001 | Moore | 451/41 |

(Continued)

OTHER PUBLICATIONS

Copending U.S. Appl. No. 10/931,361, filed Aug. 31, 2004.

*Primary Examiner*—Matthew Smith
*Assistant Examiner*—Phallaka Kik
(74) *Attorney, Agent, or Firm*—Schwegman, Lundberg, Woessner & Kluth, P.A.

(57) ABSTRACT

A method of forming a pattern of elements is shown. In one embodiment, the method is used to create a reticle. In another embodiment, the method is used to further form a number of elements on a surface of a semiconductor wafer. A pattern on a reticle is first generated using a medium such as computer software to interconnect a number of active areas on the wafer. The pattern is then modified according to a number of rules to create a pattern where substantially all spaces between planned elements exhibit a desired gap width. Layers of elements such as trace lines can be better covered with an ILD in a simplified deposition process as a result of the novel pattern formation described herein.

59 Claims, 15 Drawing Sheets

U.S. PATENT DOCUMENTS

| | | | | |
|---|---|---|---|---|
| 6,238,273 | B1 | 5/2001 | Southwick | 451/41 |
| 6,248,611 | B1 | 6/2001 | Grigg et al. | 438/106 |
| 6,269,472 | B1 * | 7/2001 | Garza et al. | 716/21 |
| 6,370,679 | B1 | 4/2002 | Chang et al. | 716/19 |
| 6,421,820 | B1 * | 7/2002 | Mansfield et al. | 716/21 |
| 6,425,117 | B1 | 7/2002 | Pasch et al. | 716/21 |
| 6,457,157 | B1 * | 9/2002 | Singh et al. | 716/2 |
| 6,470,489 | B1 | 10/2002 | Chang et al. | 716/21 |
| 6,584,610 | B1 | 6/2003 | Wu et al. | 716/19 |
| 6,667,531 | B1 | 12/2003 | Ireland et al. | 257/510 |
| 6,732,345 | B2 * | 5/2004 | Kato | 716/11 |
| 6,753,115 | B2 * | 6/2004 | Zhang et al. | 430/5 |
| 6,782,524 | B2 * | 8/2004 | Rittman | 716/19 |
| 6,795,961 | B2 * | 9/2004 | Liebmann et al. | 716/19 |
| 2001/0002304 | A1 * | 5/2001 | Pierrat et al. | 430/30 |
| 2001/0005566 | A1 * | 6/2001 | Kotani et al. | 430/5 |
| 2001/0013115 | A1 * | 8/2001 | Juengling | 716/19 |
| 2003/0118917 | A1 * | 6/2003 | Zhang et al. | 430/5 |
| 2003/0149955 | A1 * | 8/2003 | Ohnuma | 716/19 |
| 2003/0152843 | A1 * | 8/2003 | Tang | 430/4 |
| 2004/0019868 | A1 * | 1/2004 | Li | 716/11 |
| 2004/0044980 | A1 | 3/2004 | Juenglin | 716/17 |
| 2004/0181765 | A1 * | 9/2004 | Kato | 716/12 |

* cited by examiner

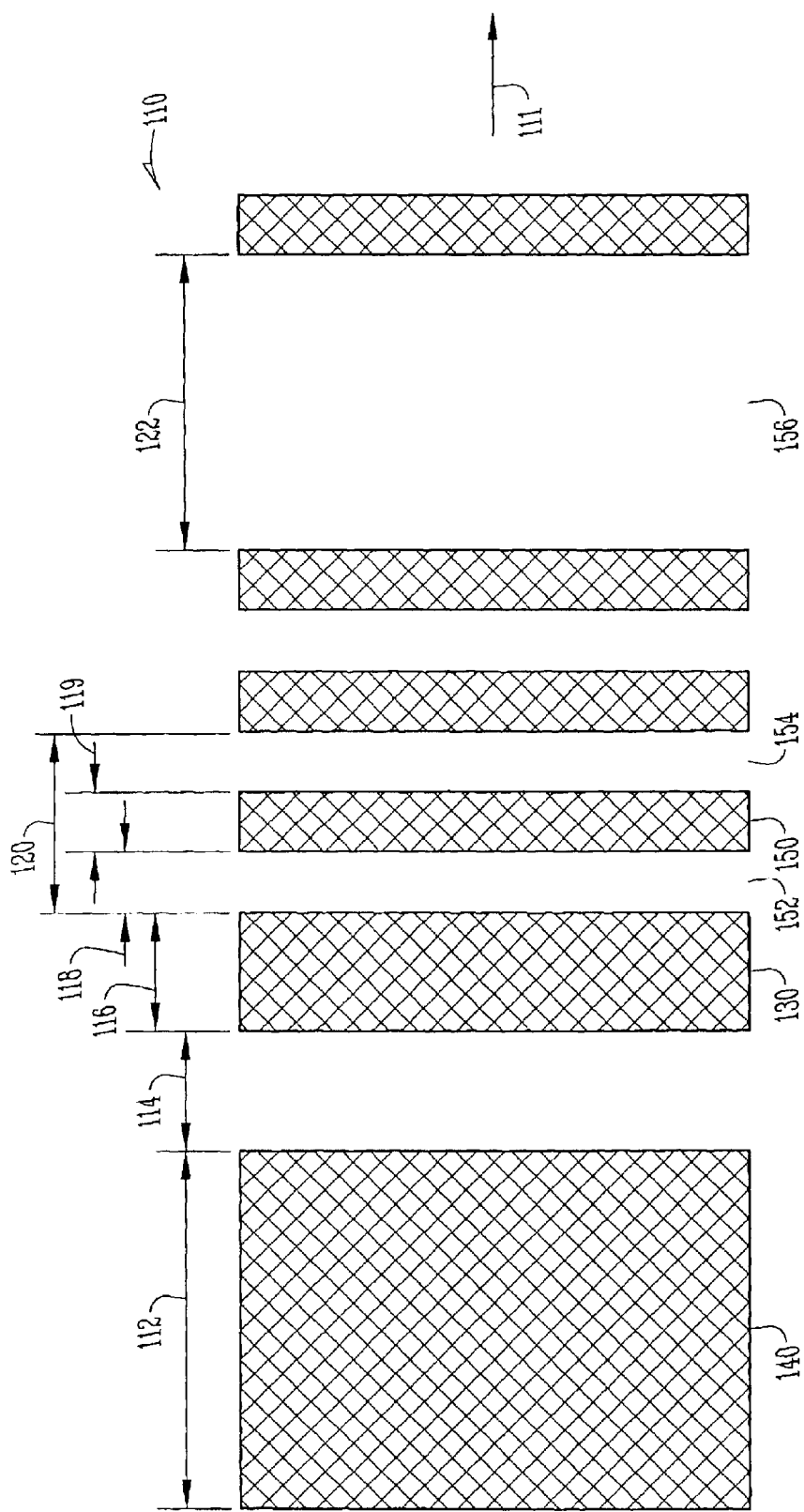

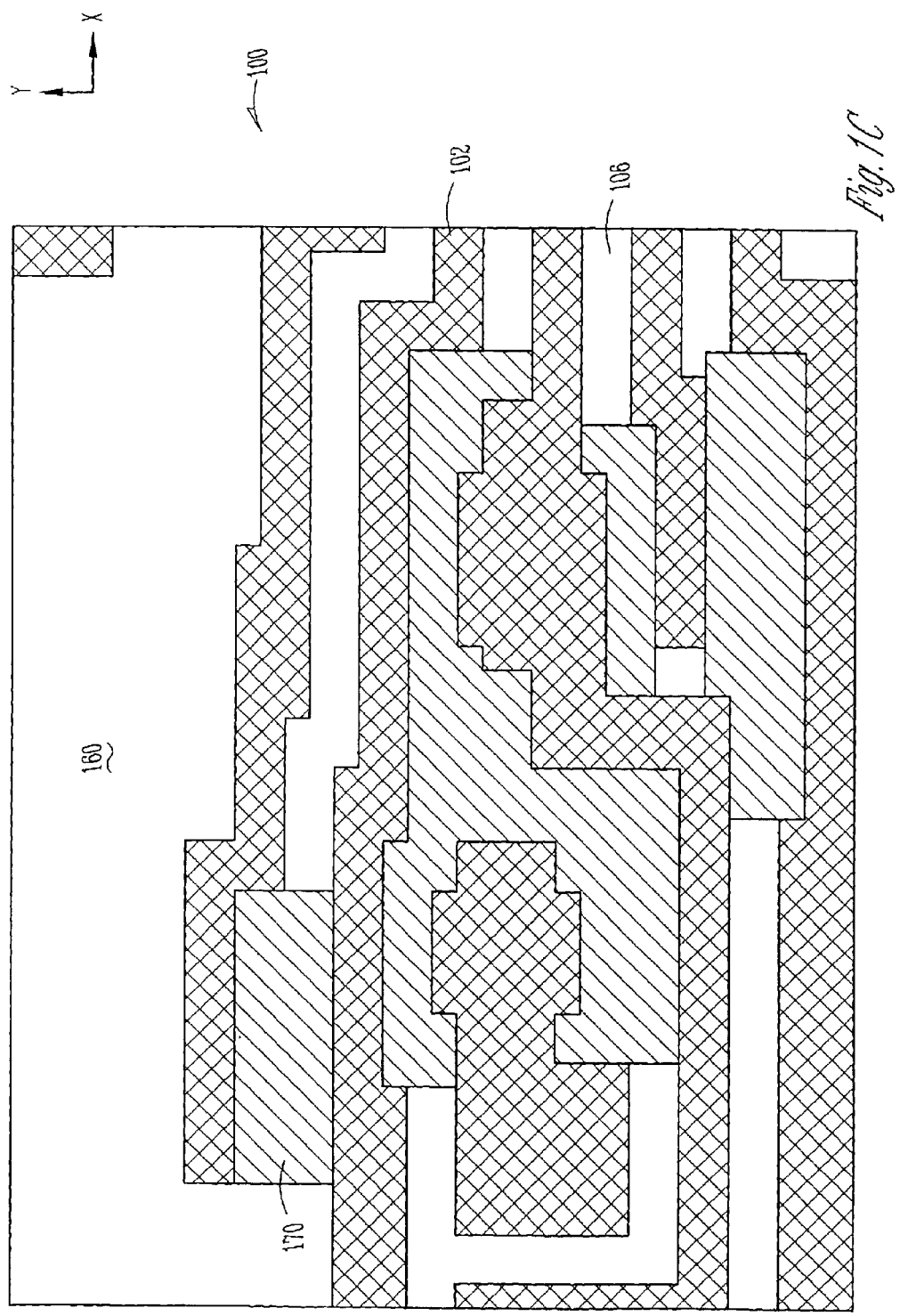

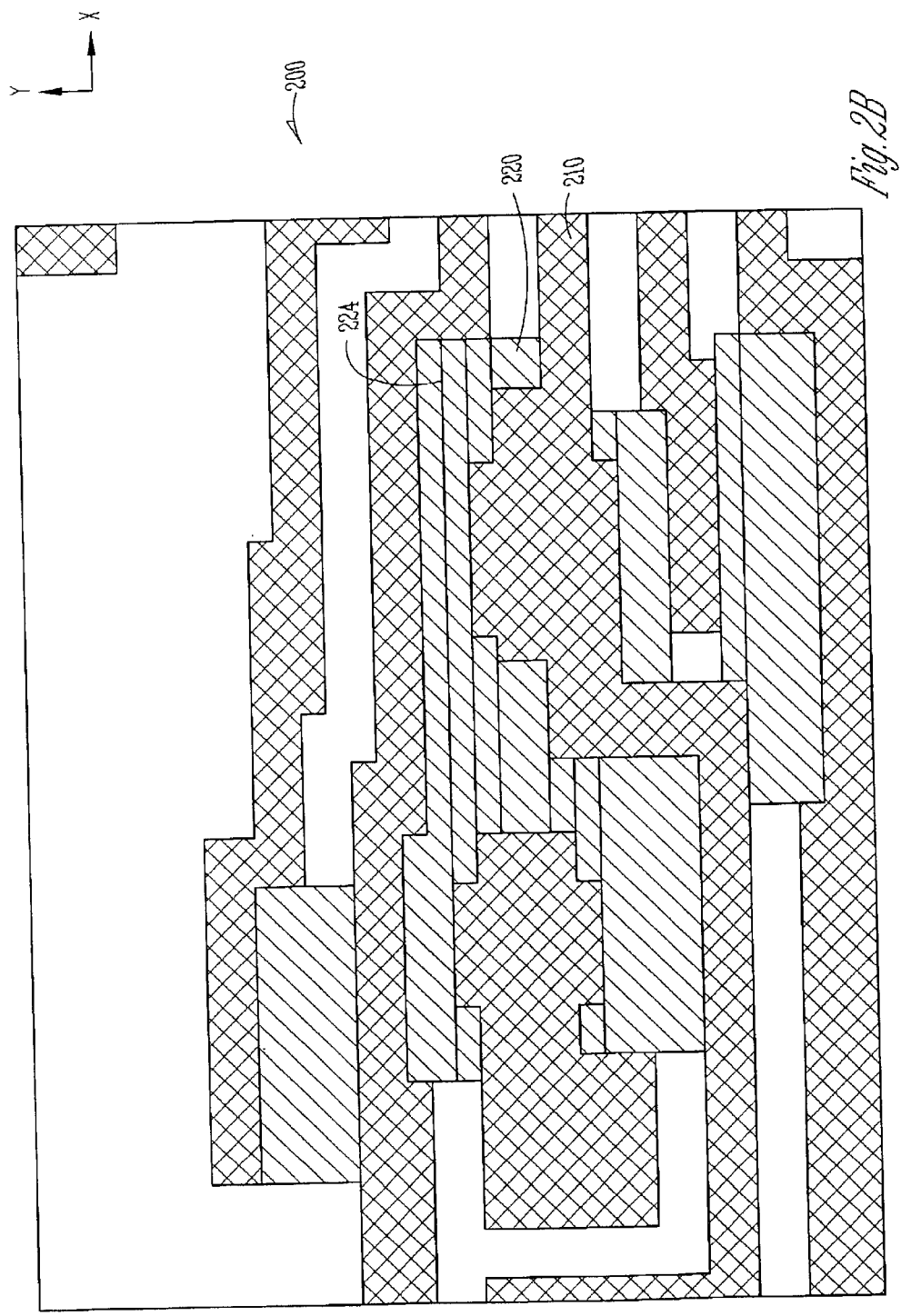

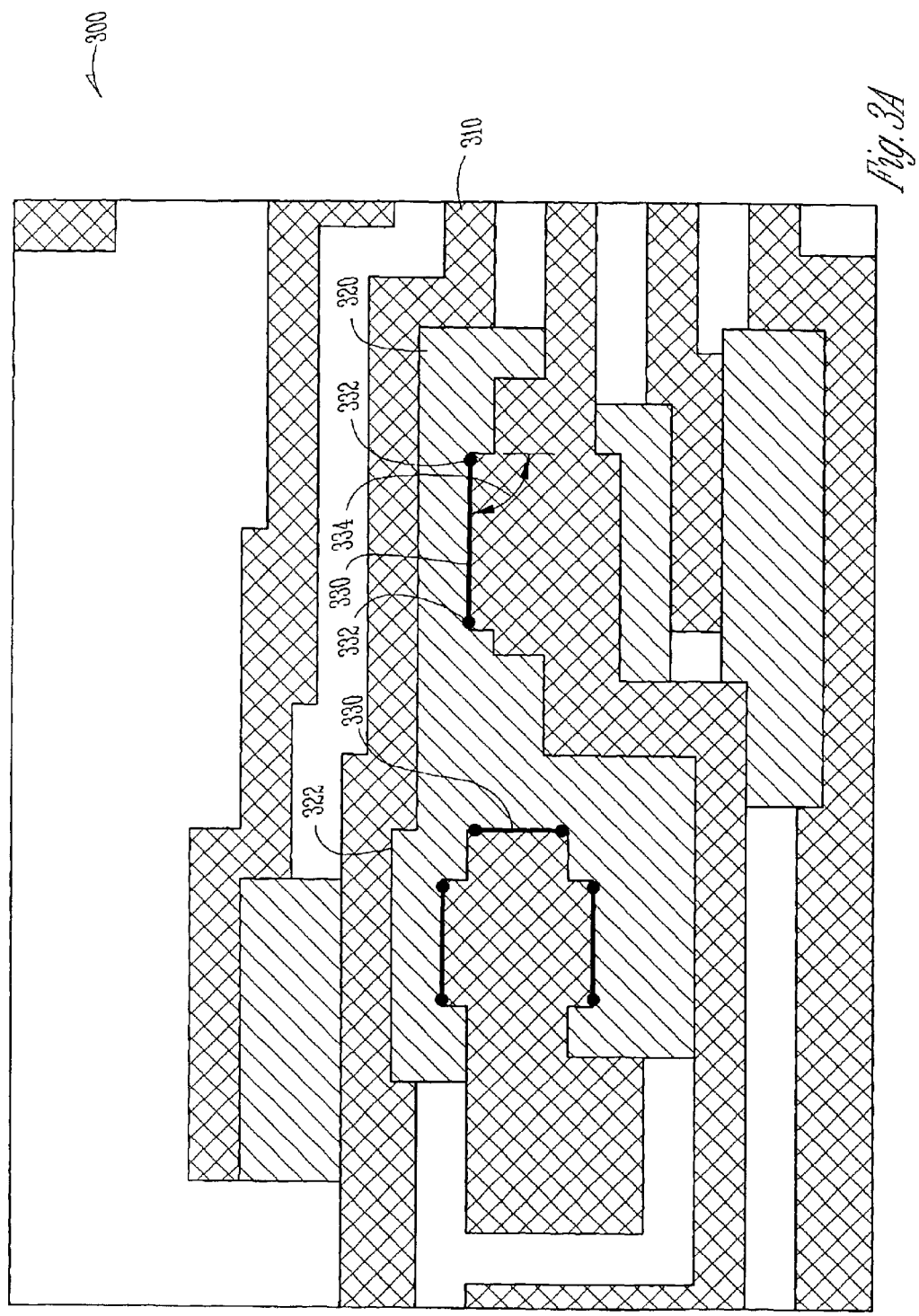

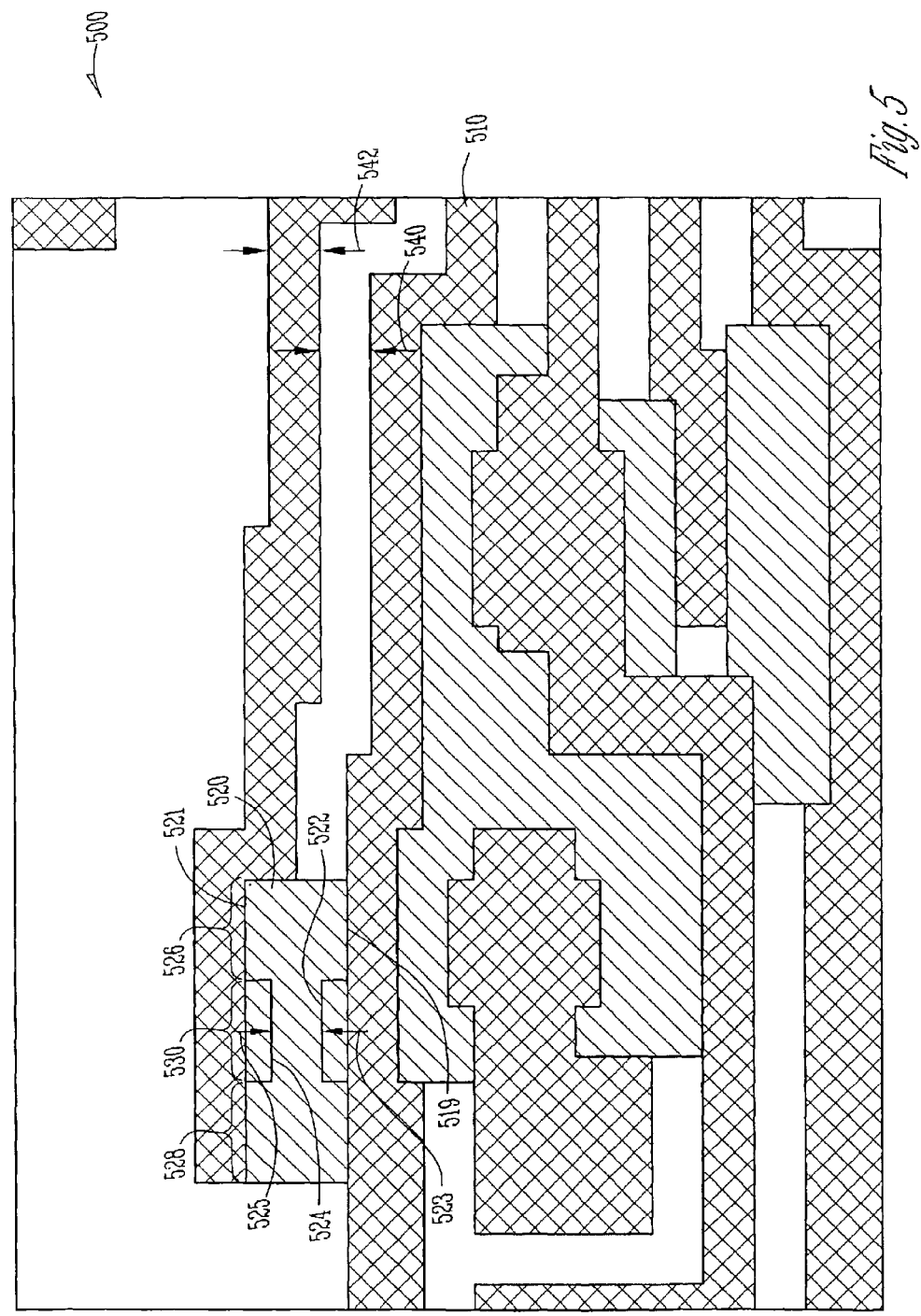

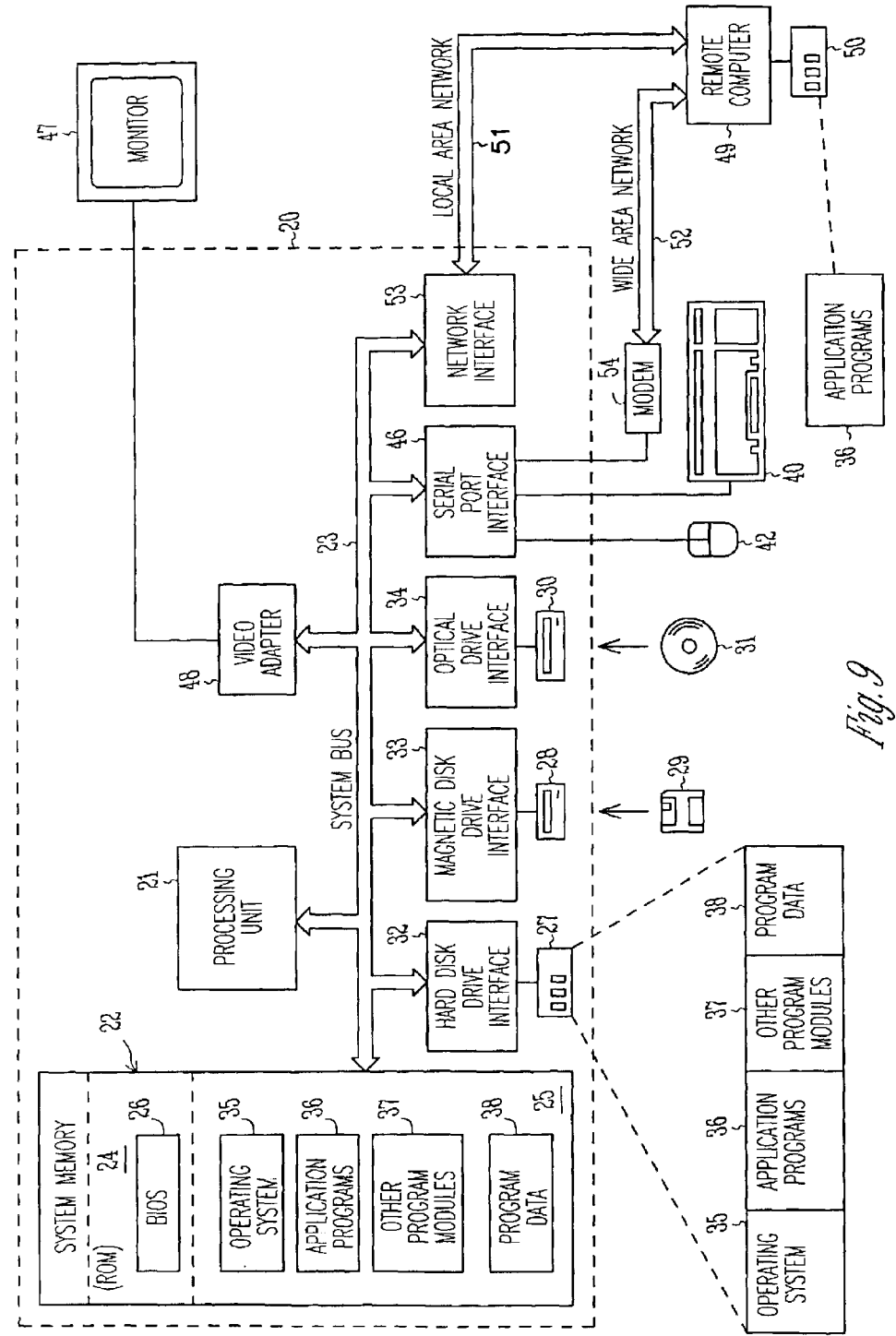

PATTERN GENERATION ON A SEMICONDUCTOR SURFACE

CROSS-REFERENCE TO RELATED APPLICATIONS

This application is related to the following co-pending, commonly assigned U.S. patent application Ser. No. 10/229,330: "Method and Apparatus for Forming a Pattern on a Semiconductor Surface," of which the disclosure is herein incorporated by reference in its entirety.

FIELD OF THE INVENTION

The invention relates to semiconductor devices and device fabrication. Specifically, the invention relates to designing patterns of elements on a surface of a semiconductor wafer.

BACKGROUND OF THE INVENTION

In fabricating integrated circuits (IC's) on a surface of a semiconductor wafer, a number of electronic devices are formed on or within the surface of the wafer. Any of a number of electronic devices may be formed on the surface of the wafer, such as transistors, capacitors, diodes, etc. Electronic devices include active areas such as a body region of a transistor, or a source/drain region of a transistor.

After the individual electronic devices are formed on the surface of the wafer, selected electronic devices must be interconnected to form the IC. One typical approach to interconnecting electronic devices is to deposit metal interconnect traces on the surface of the wafer, usually on top of the electronic devices. The interconnect traces typically take the form of trace lines, with a line width that is generally the same along a length of the trace line. The traces connect at least one active region of a first electronic device with an active region of a second electronic device, allowing the devices to communicate with one another, and perform complex operations such as processing or storing information.

Trace lines, however, create a rough surface on the wafer with the trace lines as high points, and the spaces between traces as low points. In many IC designs, there is a need to form a substantially planar surface on the wafer over the trace lines. For example, most IC designs stack multiple layers of electronic devices on top of each other. Layers of trace lines interconnect electronic devices on each respective layer, frequently with vias connecting between layers. The surface of each trace line layer must be substantially planar, and electrically isolated in order to form subsequent layers of electronic devices.

One approach in the industry has been to deposit an inter layer dielectric (ILD) over the trace lines. The ILD electrically isolates the trace line layer, and it can be planarized to form the necessary surface for subsequent layers. Current devices and methods design a pattern of trace lines that merely considers electrical connection of electronic devices. The effects of the chosen pattern on subsequent wafer fabrication steps such as deposition of an ILD layer is not currently considered. Current devices and methods require multiple steps and multiple layers for effective isolation and planarization of the trace line layer. Current devices and methods also produce significant variation in ILD thickness. Current devices and methods are thus more costly due to additional fabrication steps, and less reliable due to resulting thickness variations. Thick ILD layer regions are undesirable, because formation of subsequent vias is difficult due to the extra distance that the vias must tunnel through. Variation in ILD thickness is undesirable because, among other problems, subsequent via etching must either under etch thick regions, or over etch thin regions of the ILD.

What is needed is a method of forming a pattern of elements, such as trace lines, on a surface of a semiconductor wafer that results in fewer subsequent fabrication steps. What is also needed is a method of forming a pattern of elements, such as trace lines, that allows a thinner, more planar deposition of an ILD layer with a more uniform thickness.

SUMMARY OF THE INVENTION

A method of forming a pattern of elements on a semiconductor wafer is shown. In one embodiment, the method includes choosing a first location of a number of edges of a number of conductive elements. The location of the number of edges define at least one space between elements. The method further includes selecting spaces that possess space dimensions within a range. The range includes a minimum dimension and a maximum dimension. The method further includes choosing a desired space dimension based on characteristics of the pattern of elements adjacent to selected spaces, and modifying the first location of at least a portion of one of the number of edges to a second location. In the second location, the space dimension is substantially the desired space dimension.

A machine-readable medium with instructions stored thereon is also shown. In one embodiment, the instructions, when executed, are operable to cause selection of a first location of a number of edges of a number of conductive elements. The location of the number of edges define at least one space between elements. The instructions further cause selection of TODO spaces that possess space dimensions within a range. The range includes a minimum dimension and a maximum dimension. The instructions further cause selection of a desired space dimension. The desired space dimension is based on characteristics of the pattern of elements adjacent to selected spaces. The instructions further cause modification of the first location of at least a portion of one of the number of edges adjacent to one of the TODO spaces to a second location. In the second location, the space dimension is modified to the desired space dimension.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 1B shows a simplified embodiment of a planned surface of a semiconductor wafer with a number of elements and spaces defined.

FIG. 1C shows an embodiment of a planned surface of a semiconductor wafer with additional regions defined.

FIG. 2B shows another embodiment of a planned surface of a semiconductor wafer with selected regions being subdivided.

FIG. 3A shows one embodiment of a planned surface of a semiconductor wafer with selected edges of selected regions defined.

FIG. 5 shows another embodiment of a planned surface of a semiconductor wafer with selected edges of selected regions defined.

FIG. 9 shows a block diagram of the hardware and operating environment of a suitable computer in conjunction with which embodiments of the invention may be practiced.

DETAILED DESCRIPTION OF THE PREFERRED EMBODIMENTS

Figure 1A:
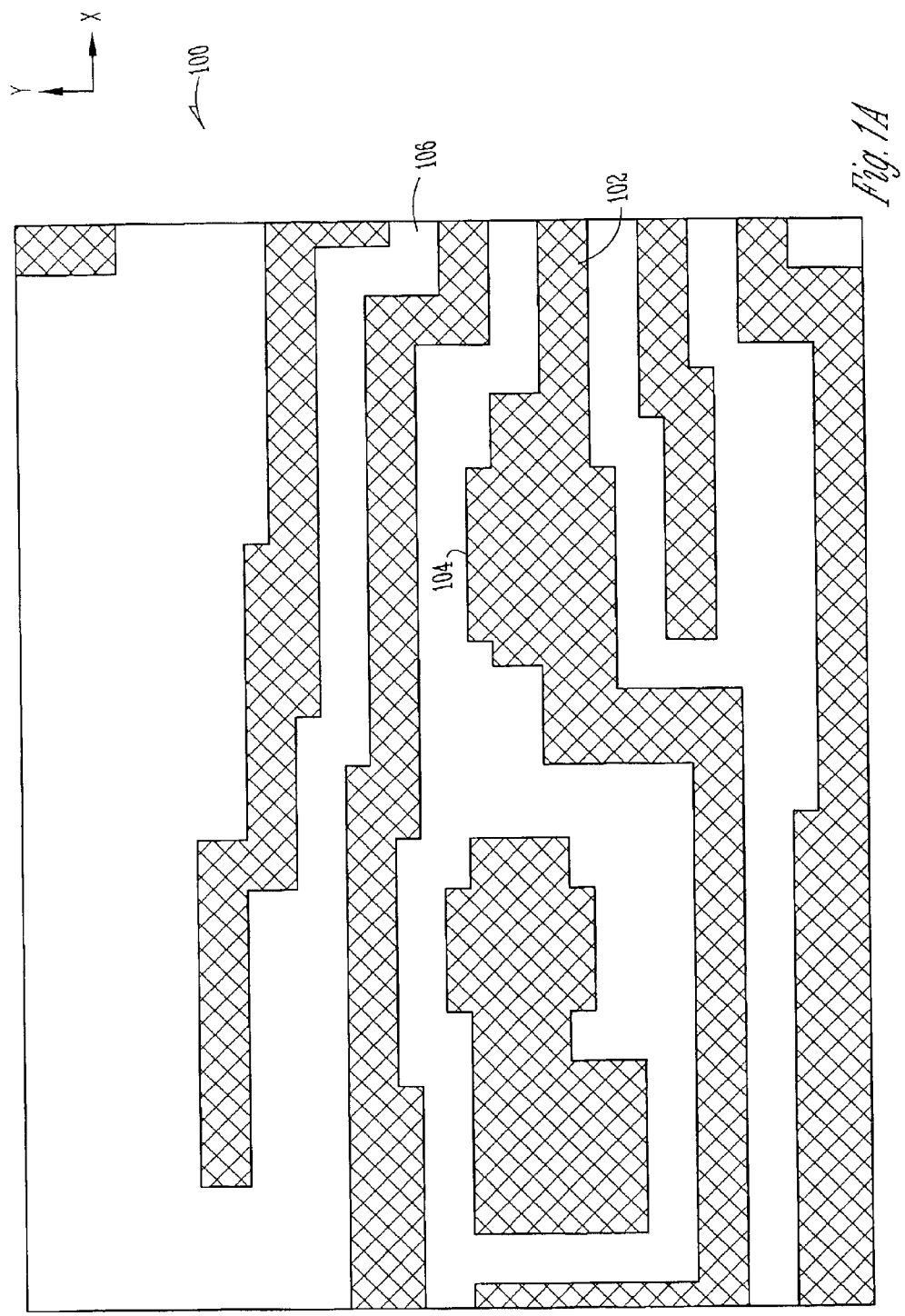
FIG. 1A shows an embodiment of a planned surface of a semiconductor wafer with a number of elements and spaces defined.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1A shows a first planned surface 100 of a semiconductor wafer. In one embodiment, the first planned surface 100 is not in a final state. In one embodiment, the first planned surface has not been put into a permanent physical form such as in a reticle for photolithographic processing, or a pattern of physical trace lines. In one embodiment, the first planned surface 100 is defined by data stored on a machine readable media, such as a computer memory, a hard disk drive, a floppy disk, optical storage, other storage media, etc.

The first planned surface 100 includes a number of conductive elements 102, each defined by a number of edges 104. In one embodiment, the conductive elements include a metal. In one embodiment, a single element metal, such as aluminum is used. In one embodiment, a metal is included in an alloy. Other conductive materials are also possible, such as semiconductors. In one embodiment, the conductive elements 102 include trace lines. In one embodiment, the conductive elements 102 are adapted to interconnect at least a pair of active regions, such as source/drain regions of transistors. In one embodiment, the conductive elements 102 of the first planned surface 100 are located based primarily on electrical considerations of interconnecting a number of active regions. In FIG. 1A, the edges 104 of the conductive elements 102 define a number of spaces 106 between elements. Along a chosen direction, such as a Y-direction, a dimension of the spaces 106 can be measured.

FIG. 1B shows a number of elements 110 which are shaped in rectangles for ease of illustration. One embodiment of the invention includes a set of dimensional rules that apply to elements such as the number of elements 110. The following description of dimensional rules between elements 110 is applicable to the conductive elements 102 shown in FIG. 1A. In FIG. 1B, all dimensions are measured along direction 111. One of ordinary skill in the art, with the benefit of the present disclosure, will recognize that although the single direction 111 is shown in FIG. 1B, the rules described herein regarding element and space dimensions are applicable to any chosen measurement direction in a pattern of elements.

Element 130 is shown with a threshold dimension 116. Element 140 is shown with a second dimension 112 that is greater than the threshold dimension 116. Element 130 is shown separated from element 140 by a desired large element gap 114. In one embodiment, the desired large element gap is defined as the minimum spacing dimension that can be located adjacent to an element with an element dimension larger than the threshold dimension 116. As shown, element 140 includes the second dimension 112 that is larger than the threshold dimension 116, therefore the minimum separation between elements 140 and 130 is the desired large element gap 114.

Element 150 is shown with a third dimension 119 that is smaller that the threshold dimension 116. In one embodiment, the third dimension 119 is defined as a minimum lithographic line width. Element 150 is shown directly adjacent to a first space 152 and a second space 154. The first space 152 is shown with a minimum space dimension 118. In one embodiment, the first space 152 and the second space 154 have substantially the same minimum space dimension 118. An SLS dimension 120 is defined as being substantially equal to a space+line+space (SLS) where the line is the minimum lithographic line dimension, and the two adjacent spaces are both equal to the minimum lithographic space as formed when adjacent to a minimum lithographic line dimension.

It should be noted that the minimum space dimension 118 is smaller than the desired large element gap 114. This is allowed due to lithographic techniques that allow thin spaces, but only when they are adjacent to elements thinner than a certain dimension. In one embodiment, elements that are thin enough to be located next to a space smaller than desired large element gap 114 must have element dimensions in a limited range. In one embodiment, the limited range includes the minimum lithographic line width 119 and the limited range can be as large as the threshold dimension 116.

A third space 156 is further shown in FIG. 1B with a dimension 122 that is greater than the SLS dimension 120. In one embodiment, a FLOAT area is defined as an area with dimensions that are large enough to allow insertion of at least one element within the FLOAT area while complying with the above described dimensional rules. Additional elements within a FLOAT area, in one embodiment, are referred to a floating elements because they are not coupled to any active areas of electronic devices. The additional elements are electrically "floating" on top of an isolated substrate region. In one embodiment, floating elements are included to improve subsequent ILD layer deposition kinetics as discussed below.

In FIG. 1B, the dimension 122 of the third space 156 allows insertion of an additional element, and thus qualifies as a FLOAT space dimension. It should be noted that the smallest dimension of a FLOAT area dimension depends on the dimensions of the elements that surround the area. The minimum lithographic line width 119 remains the same in one embodiment for all configurations. However, according to the dimensional rules above, if surrounding elements include one or more "large" elements with dimensions greater than the threshold dimension 116, then the desired large element gap 114 is needed adjacent to the floating element. Likewise, if surrounding elements include one or more elements with dimensions less than or equal to the threshold dimension 116, then a space as small as the minimum space dimension 118 can be used. In one embodiment, a FLOAT area includes both desired large element gap 114 dimensions surrounding a floating element and minimum space dimensions 118 surrounding the floating element.

A TODO area is defined as a space between elements with at least one dimension that is larger than desired large element gap 114 where the space is also not large enough to insert a floating element under the above dimensional rules. TODO areas are located in a pattern of elements and modified as described below.

Dimensional rules such as the rules described above are driven by subsequent wafer processing steps in one embodiment. As discussed above, it is often desirable to form subsequent structure such as an inter layer dielectric (ILD) between elements on a wafer, such as conductive elements 102 from FIG. 1A. In many designs, the ILD must be substantially planar, and a thin, consistent ILD layer is more desirable due to subsequent addition of conductive vias through the ILD.

It has been discovered that the deposition process of an ILD layer using processes such as spin-on-glass or CVD is not isotropic. Spaces of different sizes and dimensions fill at different rates. Anisotropic fill rates are minimized by controlling space dimensions, which leads to a more consistent, planar ILD surface, and a more simple fabrication process for deposition and planarization of the ILD surface. Dimensional rules, in one embodiment, are chosen based on these ILD fill dynamics considerations. Dimensions such as the desired large element gap 114, the minimum space dimension 118, etc. provide an ILD deposition process requiring fewer steps, resulting in a thinner, more planar, more consistent ILD layer that is more reliable. Likewise, in one embodiment, the addition of floating elements is driven by the desire for spaces between elements in a pattern that are more easily filled and planarized in a subsequent ILD process. In one embodiment, a pattern of elements utilizing dimensional rules as described above can be filled and planarized in a single processing operation.

FIG. 1C shows the spaces 106 of FIG. 1A further divided into categories based on the dimensions of the spaces 106 and the dimensional rules above. The first planned surface 100, in FIG. 1C, shows a FLOAT region 160. The first planned surface 100 in FIG. 1C also includes a number of TODO regions 170. In one embodiment, the dimensions of elements and spaces at various locations in the first planned surface 100 are measured substantially along X and Y directions as indicated in the Figures. One skilled in the art, having the benefit of the present disclosure, will recognize that a dimension of the spaces 106 can be alternatively measured on any of a wide range of directions other than X and Y directions.

The following descriptions and Figures describe methods that are used to convert the first planned surface 100 to a surface with spaces that conform to dimensional rules as described above, and as a result are more easily filled by an ILD fabrication process. In one embodiment, edges of FLOAT regions 160 are not modified. In one embodiment, the TODO regions are modified based on methods that are described below.

Edges or portions of edges of conductive elements adjacent to the TODO region are identified and ranked based on a set of movement rules. The edges or portions of edges are then moved according to the movement rules with the highest ranking edges moving first. In this way, the spaces between elements are substantially brought within the space dimensional rules described above. It should again be noted that location and movement of edges and spaces is performed in a virtual environment, such as in a computer. In one embodiment, the final planned pattern of elements is in a state that is more effective for subsequent processing steps such as ILD deposition.

Figure 1D:
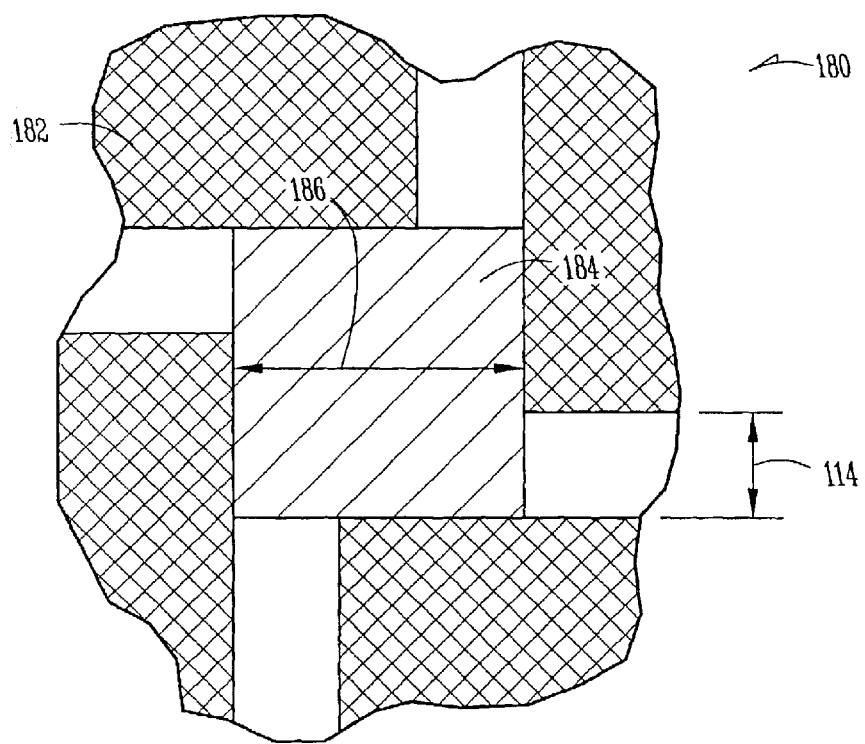
FIG. 1D shows a particular pattern in an embodiment of a planned surface.

In addition to bringing the pattern of elements into compliance with dimensional rules, in one embodiment the movement rules are designed to avoid dead end patterns. If edges are not moved in a certain order, it is possible to create dead end patterns that do not conform to the space dimensional rules as described above, yet at the same time, movement rules do not allow movement of edges to correct the dead end pattern. One example of a dead end pattern includes a "pinwheel" pattern. FIG. 1D shows an example of a pinwheel pattern 180. Because all adjacent elements 182 include dimensions greater that the threshold dimension 116, a desired large element gap 114 is needed between the elements. As indicated in FIG. 1D, the TODO region 184 is a square with dimension 186 measuring larger than a desired large element gap, but smaller than a FLOAT area under the given conditions (two times a desired large element gap plus a minimum lithographic dimension). This region is a dead end because the space is larger than desired large element gap, floating elements cannot be added and no edges can be moved into the TODO region under the dimensional rules because at least a desired large element gap 114 is needed between any moved edges. In one embodiment, the movement rules avoid dead end patterns by using rules such as edge rankings and edge movement distance rules.

Figure 2A:
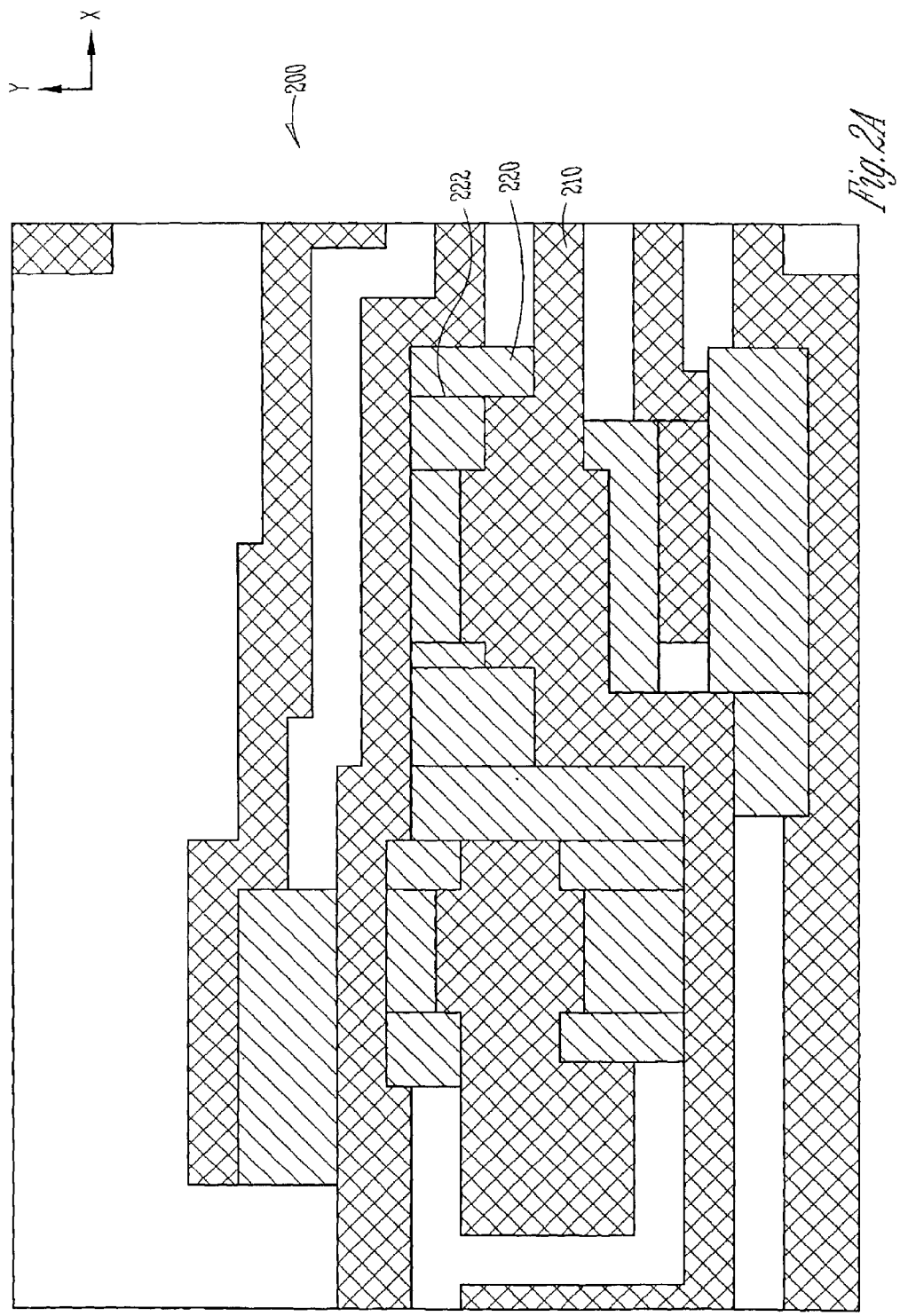
FIG. 2A shows one embodiment of a planned surface of a semiconductor wafer with selected regions being subdivided.

In one embodiment, movement rules include subdividing the TODO regions, or fracturing the TODO regions into smaller regions before moving any edges. FIG. 2A shows a planned surface 200 with a number of conductive elements 210 and a number of TODO regions 220. A selected TODO region 220 is shown fractured along the X-direction into a number of rectangles by defining a number of sub-edges 222 of the TODO region that are normal to the X-direction. In one embodiment, edges of the conductive elements 210 adjacent to newly formed sub-regions of the TODO region 220, and normal to the X-direction are moved in the X-direction. Similarly, in FIG. 2B, a TODO region 220 is shown fractured along the Y-direction into a number of rectangles by defining a number of sub-edges 224 of the TODO region that are normal to the Y-direction. In one embodiment, edges of the conductive elements 210 adjacent to newly formed sub-regions of the TODO region 220, and normal to the Y-direction are moved in the Y-direction.

One advantage of fracturing the TODO regions into sub-regions is that the sub-regions are geometrically more simple than the parent TODO region. In one embodiment, computations and evaluations involving the sub-regions are less complex. Although rectangles are shown in FIGS. 2A and 2B, other geometric shapes are within the scope of the present disclosure.

In one embodiment, fracturing of TODO regions is performed along one direction at a time. In one embodiment, fracturing and moving edges of TODO regions is performed a number of times. In one embodiment, fracturing and moving of edges is iteratively performed in the X-direction and the Y-direction until the TODO regions are substantially in compliance with the dimensional rules described above. In one embodiment, movement rules include a rule where edges of conductive elements are allowed to move only within a sub-element that is bounded by the edge to be moved. In one embodiment, movement rules include a rule where if multiple co-linear edges of a conductive element are adjacent to a sub-element of a TODO region, the multiple co-linear edges are moved together by the same amount.

Figure 3B:
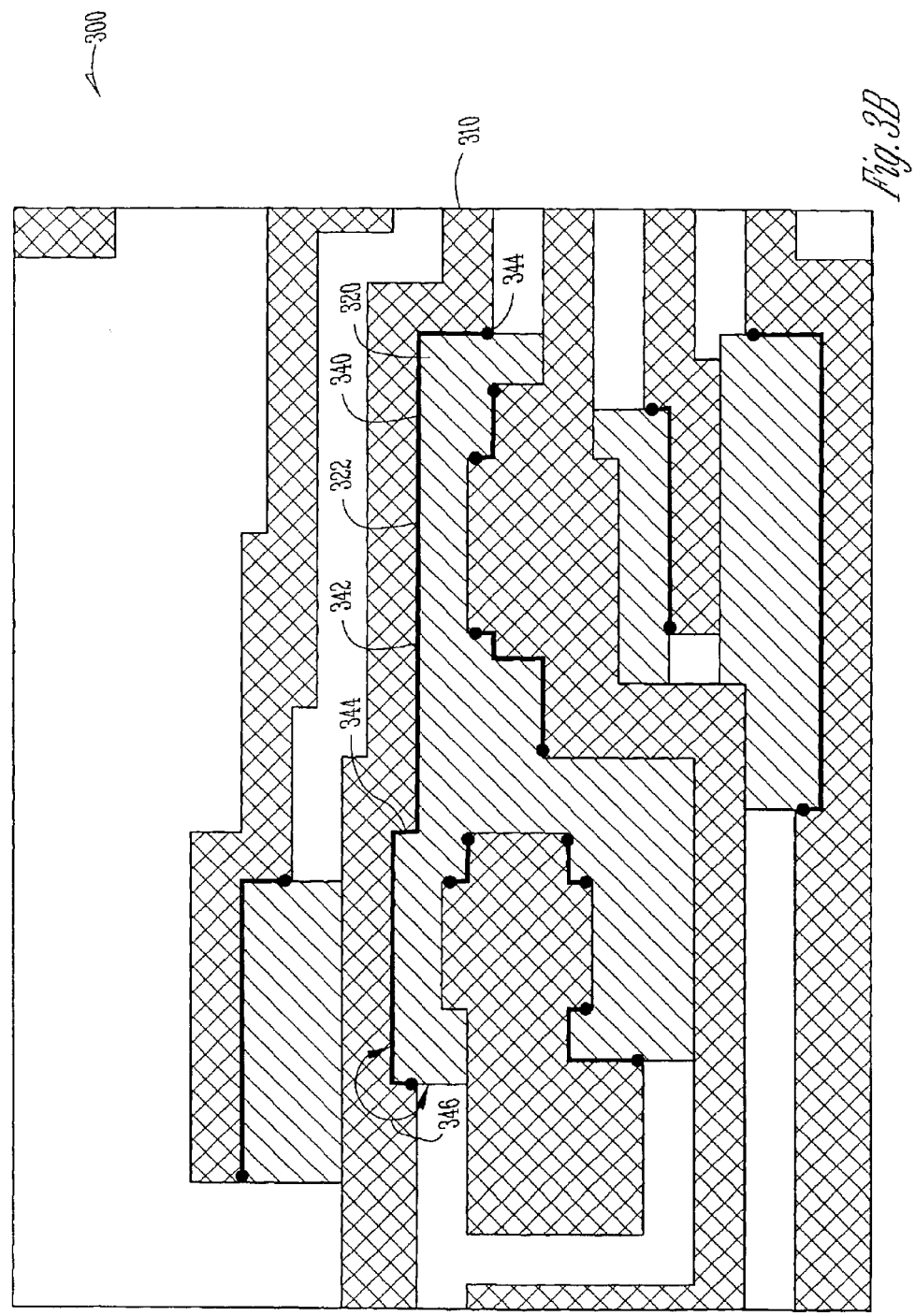
FIG. 3B shows another embodiment of a planned surface of a semiconductor wafer with selected edges of selected regions defined.
Figure 3C:
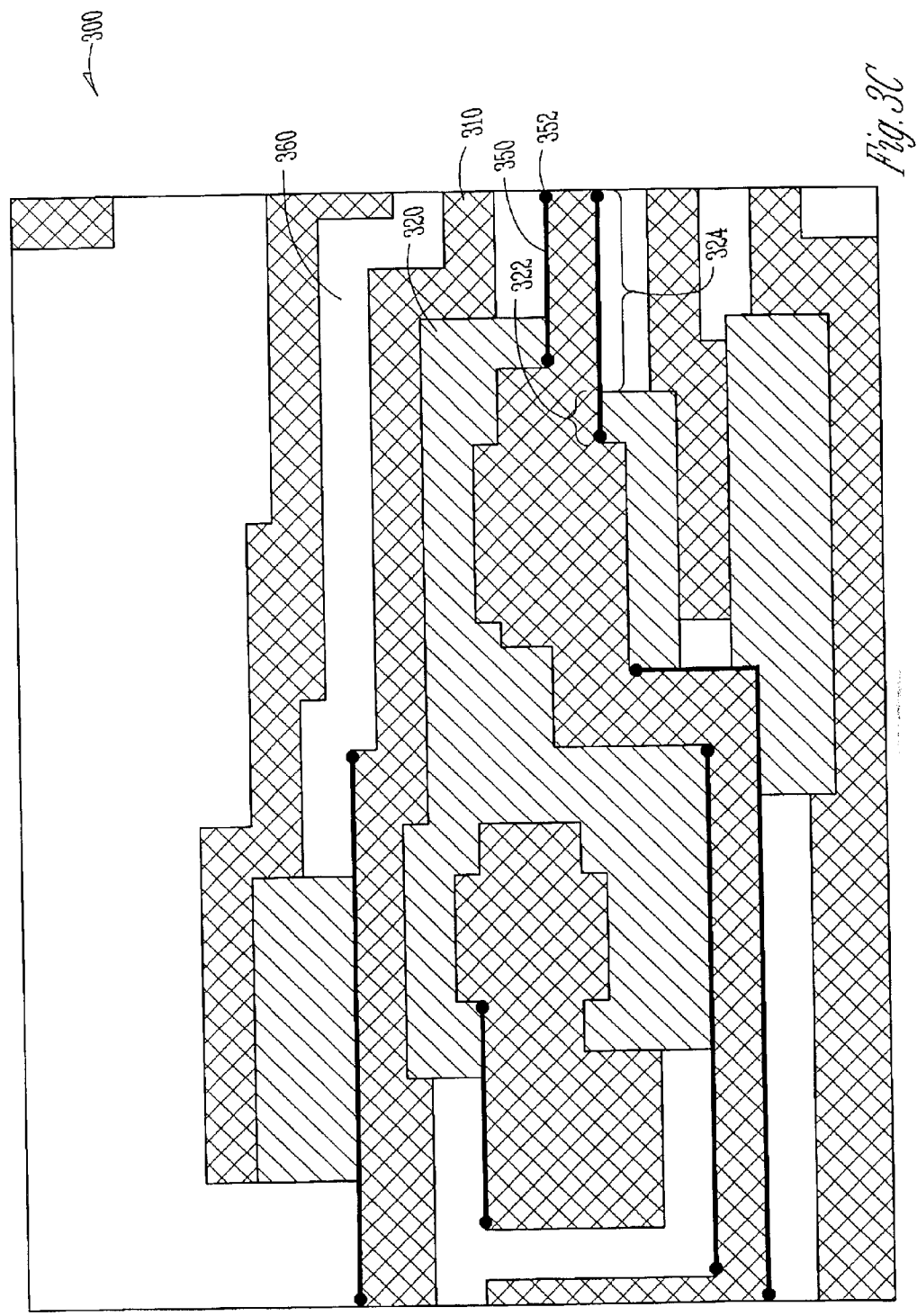
FIG. 3C shows another embodiment of a planned surface of a semiconductor wafer with selected edges of selected regions defined.

FIGS. 3A–3C illustrate additional movement rules based on edge classification. FIG. 3A shows a planned surface 300 for a semiconductor wafer. The planned surface 300 includes a number of conductive elements 310 with a number of spaces defined between edges of the conductive elements 310. A number of TODO regions 320 are also shown. The TODO regions 320 form boundaries 322 with selected conductive elements 310 along various edges of the conductive elements 310 or along portions of edges of the conductive elements 310.

The edges of conductive elements 310, in one embodiment, are classified according to certain characteristics of the boundaries 322. FIG. 3A shows a number of inside edges 330 that are highlighted by a bold line and inside edge endpoints 332. In one embodiment, the inside edges 330 are defined as edges of the conductive elements 310, and not edges of the TODO regions 320. In one embodiment, the inside edges 330 are each further defined as sharing a continuous common boundary 322 with a TODO region. In one embodiment, while evaluating a classification of an edge of a conductive element 310, the entire edge between corners must be considered. In one embodiment, the inside edges are each further defined as an edge of a conductive element 310 where both inside edge endpoints 332 include outside corners of the conductive elements 310. Outside corners, in one embodiment, are defined as corners with conductive element angles 334 that are less than 180 degrees as measured across the conductive element. In one embodiment, the conductive element angles 334 are approximately 90 degrees.

FIG. 3B shows the planned surface 300 with the conductive elements 310 and the TODO regions 320. FIG. 3B highlights a number of corner edge groups 340. The corner edge groups 340 include a number of linked individual corner edges 342. The individual corner edges are each bounded by corner edge endpoints 344. Similar to inside edges discussed in FIG. 3A, in one embodiment, the corner edges 340 are defined as edges of the conductive elements 310, and not edges of the TODO regions 320. In one embodiment, the corner edges 340 are each further defined as sharing a continuous common boundary 322 with a TODO region. In one embodiment, while evaluating a classification of an edge of a conductive element 310, the entire edge between corners must be considered. In one embodiment, the corner edges are each further defined as an edge of a conductive element 310 where at least one corner edge endpoint 344 includes an inside corner of a conductive element 310. Inside corners, in one embodiment, are defined as corners with conductive element angles 346 that are greater than 180 degrees as measured across the conductive element. In one embodiment, the conductive element angles 346 of inside corners are approximately 270 degrees.

FIG. 3C shows the planned surface 300 with the conductive elements 310 and the TODO regions 320. FIG. 3C highlights a number of straddling edges 350 with straddling edge endpoints 352. Similar to inside edges and corner edges discussed in FIGS. 3A and 3B, in one embodiment, the straddling edges 350 are defined as edges of the conductive elements 310, and not edges of the TODO regions 320. In one embodiment, the straddling edges 350 are each further defined as sharing a common boundary 322 with a TODO region, as well as sharing an external boundary 324 with a space region 360 that is not a TODO region. In one embodiment, while evaluating a classification of an edge of a conductive element 310, the entire edge between corners must be considered. In one embodiment, corners at the straddling edge endpoints 352 may be either inside corners or outside corners as defined above.

In one embodiment, the classified edges are moved in ranking order. One ranking moves the inside edges first, the corner edges second, and the straddling edges third. In one embodiment, in a situation including both inside edges and corner edges, the edges are both ranked as corner edges. In one embodiment, in a situation including inside edges, corner edges, and straddling edges, the edges are all ranked as straddling edges. Movement rules that include ranking of edges as described above avoid dead end structures, such as pinwheels. In one embodiment, additional rules as described below are included for moving notches and moving structures of long parallel edges.

Figure 4:
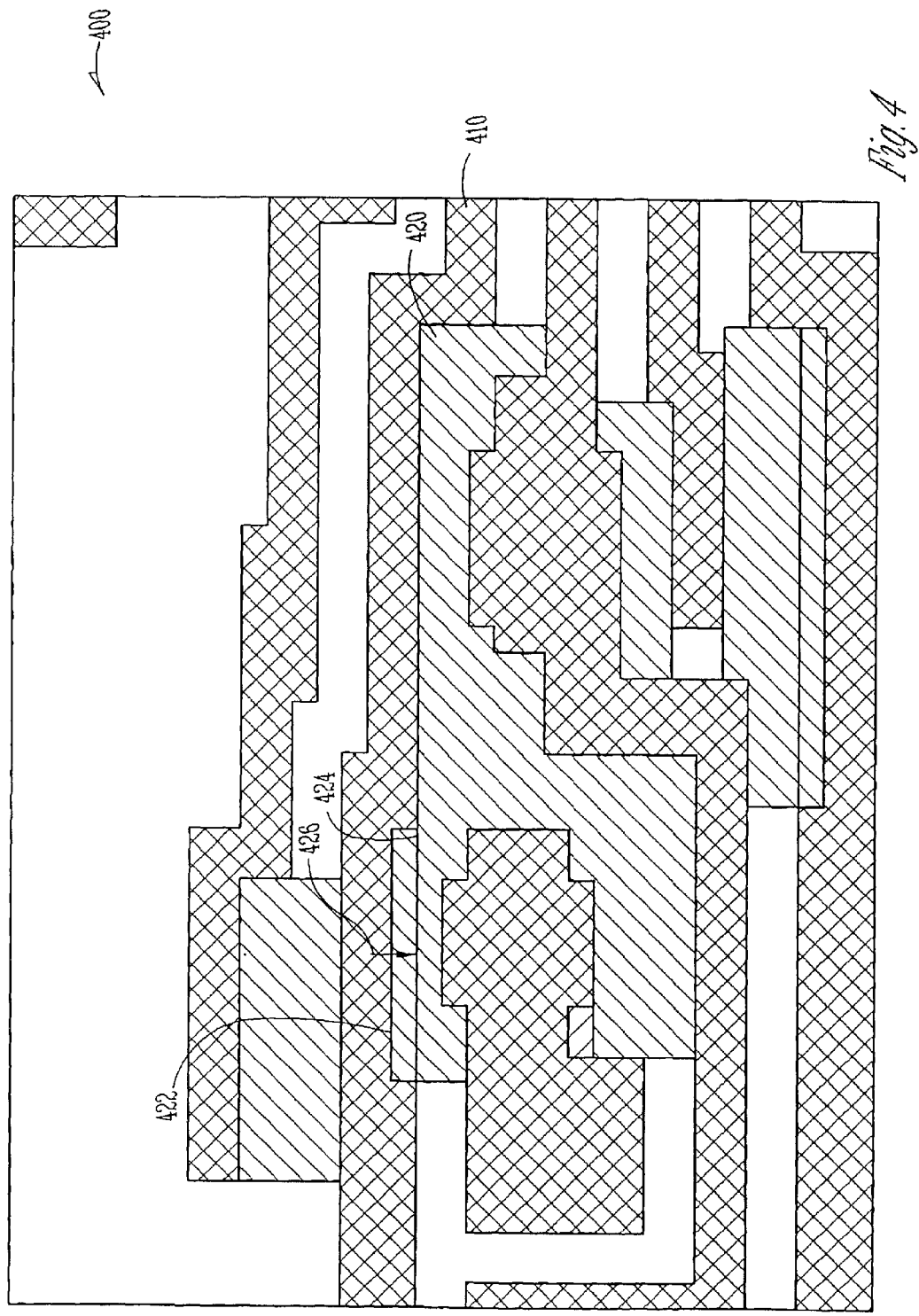
FIG. 4 shows one embodiment of a planned surface of a semiconductor wafer with selected edges of selected regions defined.

FIG. 4 shows a planned surface 400 with a number of conductive elements 410 and a number of TODO regions 420. An edge 422 is identified for a move, and is moved along direction 426 to a second location 424. In one embodiment, the edge 422 is classified as a notch. In one embodiment, a notch includes a corner edge that includes an outside corner on both corner edge endpoints. In one embodiment, notches are moved with the highest priority.

FIG. 5 shows a planned surface 500 with a number of conductive elements 510 and a number of TODO regions 520. An edge 521 is identified as a long parallel edge with edge 519. In one embodiment, a portion of long parallel edges 521 and 519 are each moved along arrows 525 and 523 to new locations 524 and 522 respectively. In one embodiment the movement of long parallel edges is performed symmetrically as shown in FIG. 5. Symmetrical movement of long parallel edges is desirable because signal integrity is maintained in the circuit. In one embodiment, long parallel edges are moved with the same priority as notches.

Figure 6A:
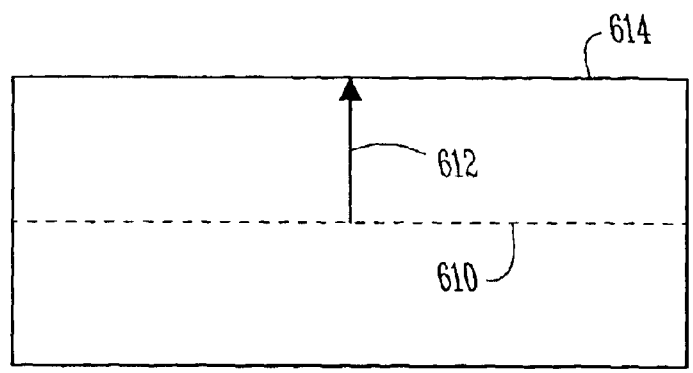
FIG. 6A shows one possible edge movement.
Figure 6B:
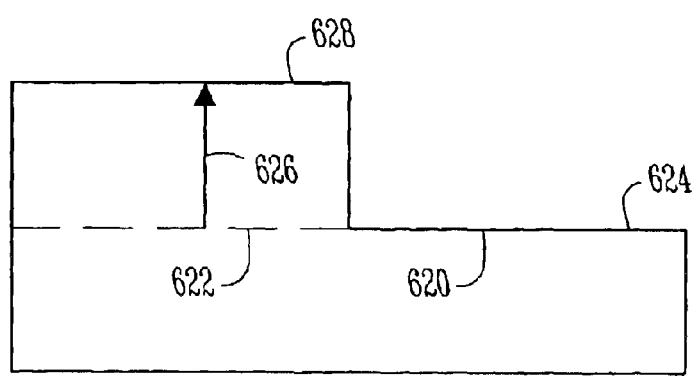
FIG. 6B shows another possible edge movement.
Figure 6C:
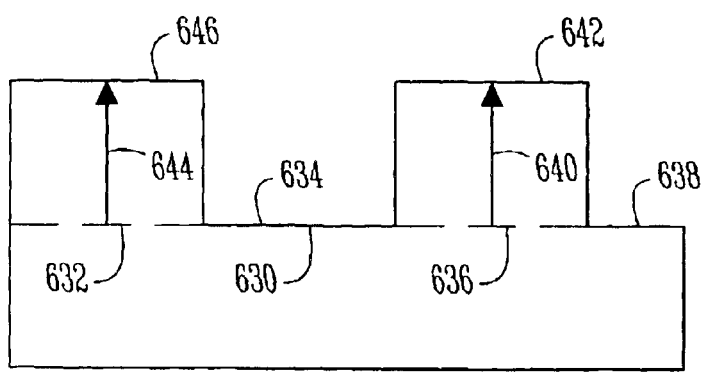
FIG. 6C shows another possible edge movement.

As shown in FIG. 6A, one embodiment moves and entire edge of an element at one time. FIG. 6A shows an initial edge location 610 as a dashed line. The initial edge location 610 is moved in the direction 612 to a second location 614. FIG. 6B shows one embodiment where a portion of an edge 620 is moved. Edge 620 is sub-divided into a first portion 622 and a second portion 624. The first portion 622, shown as a dashed line, is moved along direction 626 to a second location 628. The second portion 624 is not moved in this embodiment. FIG. 6C shows a further embodiment where an edge 630 is sub-divided into a number of portions. A first portion 632, a second portion 634, a third portion 636, and a fourth portion 638. The first portion 632 is moved along direction 644 to a second location 646. Likewise the third portion 636 is moved along direction 640 to a second location 642. The second portion 634 and the fourth portion 638 remain in their original locations. One of ordinary skill in the art, with the benefit of the present disclosure, will recognize that other similar combinations of edge subdivision, and moves are possible. FIGS. 6A–6C illustrate some examples of edge, and sub-edge movement. The invention is not so limited to these examples.

Figure 7:
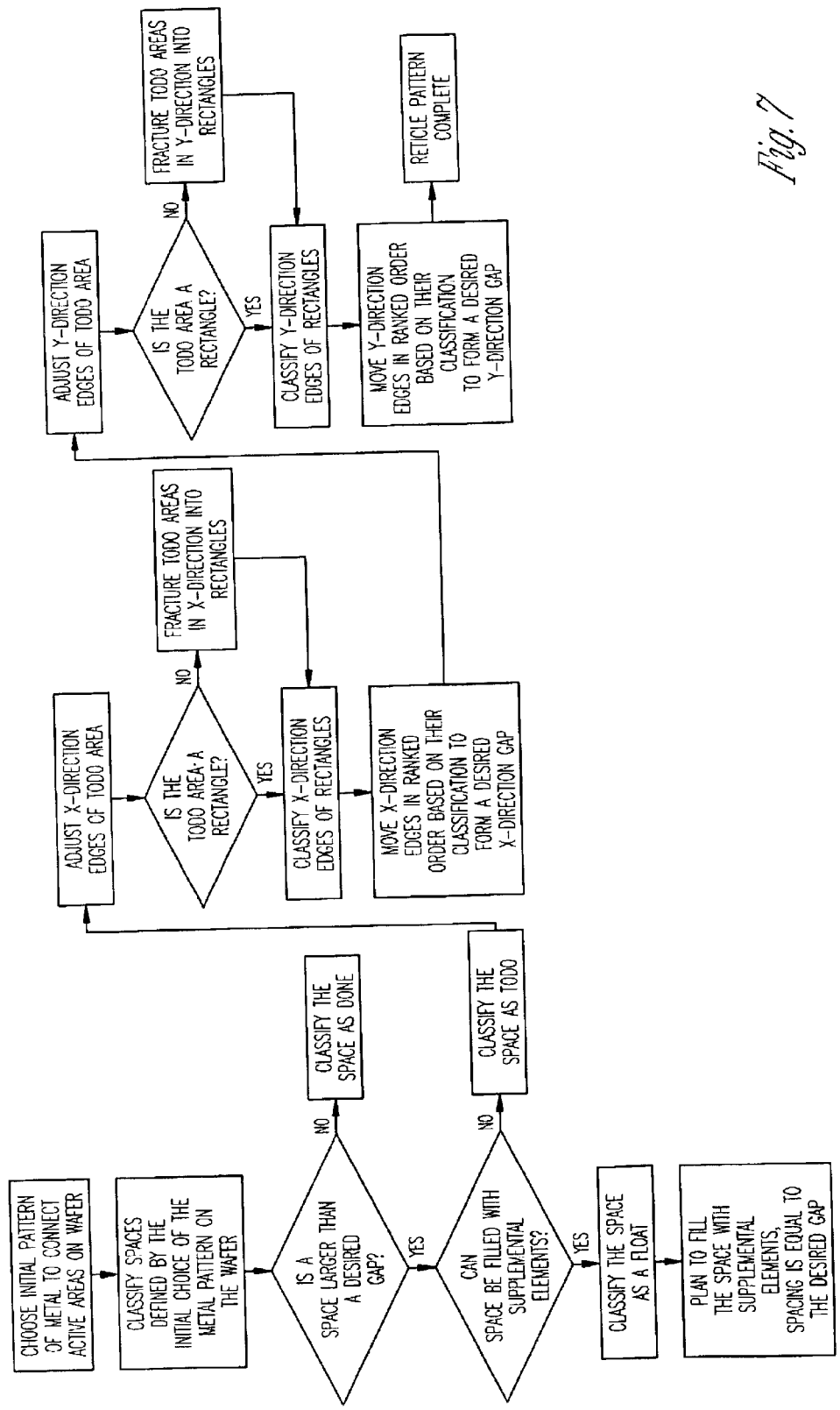
FIG. 7 shows an embodiment of a flow diagram for defining and moving selected edges of elements in a planed surface on a semiconductor wafer.

FIG. 7 shows a flow diagram of one embodiment utilizing dimensional rules and movement rules as described above. In FIG. 7, all TODO regions are sub-divided into rectangles before edge modification takes place. Although rectangles are used in one embodiment as sub-divided geometric shapes, other sub element shapes such as triangles parallelograms, etc, are also acceptable sub element shapes. The flow diagram of FIG. 7 utilizes spaces of a desired gap. In one embodiment, a desired gap includes multiple gap spacing. In one embodiment, dimensional rules as described above determine a desired gap. One possible desired gap includes a desired large element gap that is sized based on "large" adjacent conductive elements. Another possible desired gap includes a minimum lithographic gap that is sized smaller that desired large element gap only when permitted by the dimensional rules. One example allowing a minimum lithographic gap smaller than a desired large element gap includes a condition where adjacent conductive elements are sized less than or equal to a threshold dimension.

Figure 8:
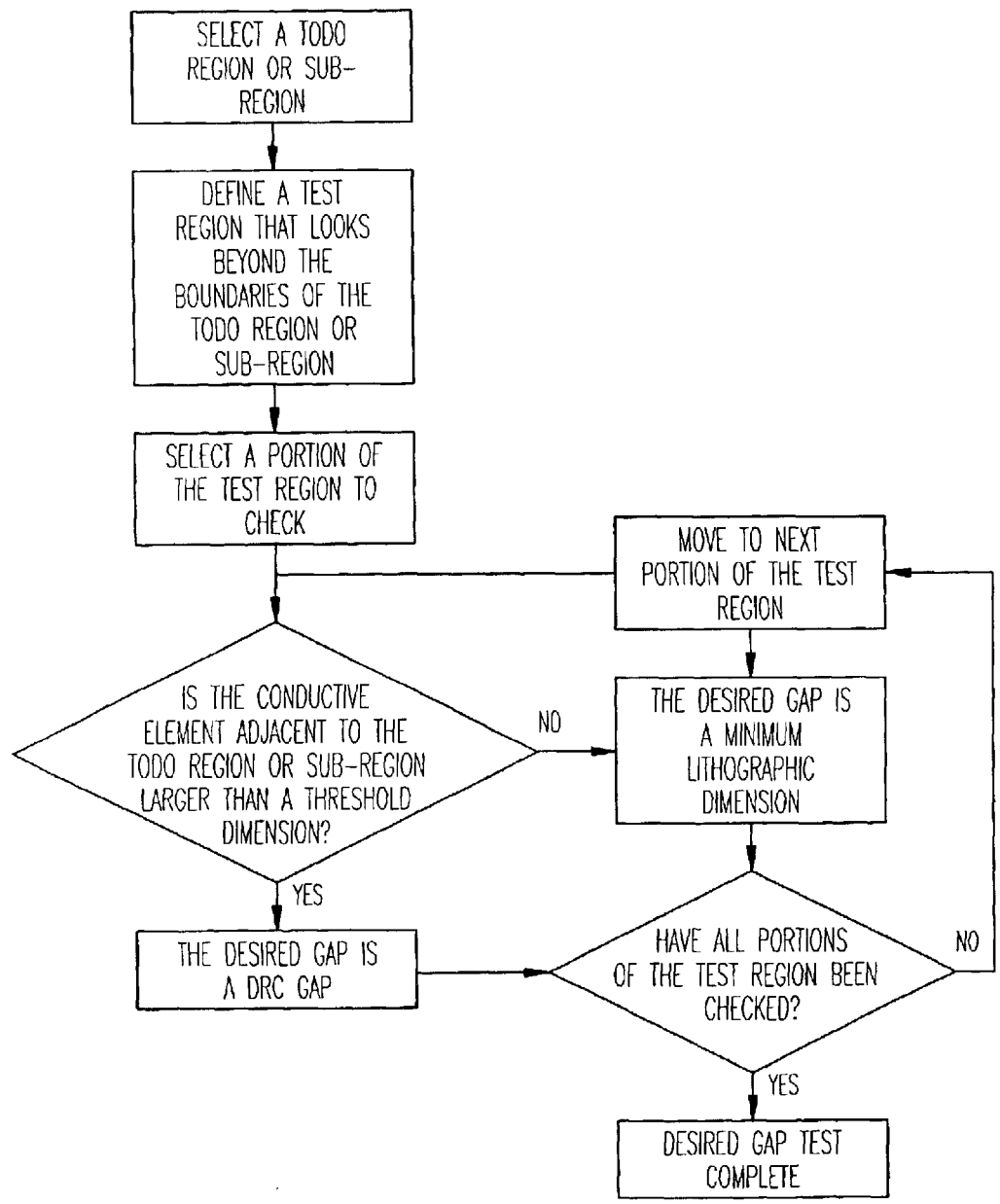
FIG. 8 shows an embodiment of a flow diagram for selecting a desired gap.

FIG. 8 shows a flow diagram of one embodiment that looks beyond adjacent edges of conductive elements of a TODO regions to help determine what a desired gap dimension is. In one embodiment, conductive elements adjacent to a TODO region are checked to see if they are "large" elements that would require a desired large element gap adjacent to them. In one embodiment, conductive elements adjacent to a TODO region are checked to see if they are sized smaller than a threshold dimension that in turn allows a minimum lithographic gap adjacent to the conductive element. In one embodiment, a test region is defined as a region with dimensions in all directions sized larger than the TODO region by an amount equal to the threshold dimension plus a small amount. If a portion of the test region intersects an adjacent portion of a conductive region, then the adjacent portion of the conductive region is labeled as being larger than the threshold dimension. Conversely, if a portion of the test region intersects a space, then the adjacent portion of the conductive region is labeled as being less than or equal to the threshold dimension. While checking a test region as described above is one possible method of characterizing adjacent conductive elements, the present invention is not so limited. Other methods that determine a variable desired gap spacing based on a size or dimensions of adjacent conductive elements are also within the scope of the present invention.

FIG. 9 provides a brief, general description of a suitable computing environment in which the above embodiments may be implemented. Embodiments of the invention will hereinafter be described in the general context of computer-executable program modules containing instructions executed by a personal computer (PC). Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network PCs, minicomputers, mainframe computers, and the like which have multimedia capabilities. The invention may also be practiced in distributed computing environments where tasks are performed by remote processing devices linked through a communications network. In a distributed computing environment, program modules may be located in both local and remote memory storage devices.

FIG. 9 shows a general-purpose computing device in the form of a conventional personal computer 20, which includes processing unit 21, system memory 22, and system bus 23 that couples the system memory and other system components to processing unit 21. System bus 23 may be any of several types, including a memory bus or memory controller, a peripheral bus, and a local bus, and may use any of a variety of bus structures. System memory 22 includes read-only memory (ROM) 24 and random-access memory (RAM) 25. A basic input/output system (BIOS) 26, stored in ROM 24, contains the basic routines that transfer information between components of personal computer 20. BIOS 26 also contains start-up routines for the system. Personal computer 20 further includes hard disk drive 27 for reading from and writing to a hard disk (not shown), magnetic disk drive 28 for reading from and writing to a removable magnetic disk 29, and optical disk drive 30 for reading from and writing to a removable optical disk 31 such as a CD-ROM or other optical medium. Hard disk drive 27, magnetic disk drive 28, and optical disk drive 30 are connected to system bus 23 by a hard-disk drive interface 32, a magnetic-disk drive interface 33, and an optical-drive interface 34, respectively. The drives and their associated computer-readable media provide nonvolatile storage of computer-readable instructions, data structures, program modules and other data for personal computer 20. Although the exemplary environment described herein employs a hard disk, a removable magnetic disk 29 and a removable optical disk 31, those skilled in the art will appreciate that other types of computer-readable media which can store data accessible by a computer may also be used in the exemplary operating environment. Such media may include magnetic cassettes, flash-memory cards, digital versatile disks, Bernoulli cartridges, RAMs, ROMs, and the like.

Program modules may be stored on the hard disk, magnetic disk 29, optical disk 31, ROM 24 and RAM 25. Program modules may include operating system 35, one or more application programs 36, other program modules 37, and program data 38. A user may enter commands and information into personal computer 20 through input devices such as a keyboard 40 and a pointing device 42. Other input devices (not shown) may include a microphone, joystick, game pad, satellite dish, scanner, or the like. These and other input devices are often connected to the processing unit 21 through a serial-port interface 46 coupled to system bus 23; but they may be connected through other interfaces not shown in FIG. 9, such as a parallel port, a game port, or a universal serial bus (USB). A monitor 47 or other display device also connects to system bus 23 via an interface such as a video adapter 48. In addition to the monitor, personal computers typically include other peripheral output devices (not shown) such as speakers and printers. In one embodiment, one or more speakers 57 or other audio output transducers are driven by sound adapter 56 connected to system bus 23.

Personal computer 20 may operate in a networked environment using logical connections to one or more remote computers such as remote computer 49. Remote computer 49 may be another personal computer, a server, a router, a network PC, a peer device, or other common network node. It typically includes many or all of the components described above in connection with personal computer 20; however, only a storage device 50 is illustrated in FIG. 9. The logical connections depicted in FIG. 9 include local-area network (LAN) 51 and a wide-area network (WAN) 52. Such networking environments are commonplace in offices, enterprise-wide computer networks, intranets and the Internet.

When placed in a LAN networking environment, PC 20 connects to local network 51 through a network interface or adapter 53. When used in a WAN networking environment such as the Internet, PC 20 typically includes modem 54 or other means for establishing communications over network 52. Modem 54 may be internal or external to PC 20, and connects to system bus 23 via serial-port interface 46. In a networked environment, program modules, such as those comprising Microsoft® Word which are depicted as residing within 20 or portions thereof may be stored in remote storage device 50. Of course, the network connections shown are illustrative, and other means of establishing a communications link between the computers may be substituted. Software may be designed using many different methods, including object oriented programming methods. C++ and Java are two examples of common object oriented computer programming languages that provide functionality associated with object oriented programming. Object oriented programming methods provide a means to encapsulate data members (variables) and member functions (methods) that operate on that data into a single entity called a class. Object oriented programming methods also provide a means to create new classes based on existing classes.

An object is an instance of a class. The data members of an object are attributes that are stored inside the computer memory, and the methods are executable computer code that act upon this data, along with potentially providing other services. The notion of an object is exploited in the present invention in that certain aspects of the invention are implemented as objects in one embodiment.

An interface is a group of related functions that are organized into a named unit. Each interface may be uniquely identified by some identifier. Interfaces have no instantiation, that is, an interface is a definition only without the executable code needed to implement the methods which are specified by the interface. An object may support an interface by providing executable code for the methods specified by the interface. The executable code supplied by the object must comply with the definitions specified by the interface. The object may also provide additional methods. Those skilled in the art will recognize that interfaces are not limited to use in or by an object oriented programming environment.

CONCLUSION

Computers and computer-executable program modules, etc are used in one embodiment of the invention to generate patterns as described above for use on a semiconductor surface. The detailed description of the method and associated devices above is used, in one embodiment, to create a reticle for lithography of a semiconductor wafer surface. In one embodiment, a pattern on the reticle is first generated using computer software to interconnect a number of active areas on the wafer. The first pattern is not physically formed, and it's pattern is stored as data for modification as described above. The first pattern is then modified according to the teachings above to create a pattern that conforms to dimensional rules as described above with desired spaces between elements. In further embodiments, a semiconductor wafer is formed using the reticle generated by the method of the software described above. Elements such as metal trace lines are formed on the wafer in one embodiment, although the invention is not limited to metal trace lines.

Layers of elements such as trace lines can be better covered with an ILD in a simplified deposition process due to the teachings of pattern formation as described above. An ILD layer can also be deposited over a layer of elements in a planar surface that is thinner and more consistent in thickness than was possible using prior techniques. An ILD layer that is thinner and more consistent than prior ILD layers provides benefits such as the ability to form more reliable vias.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a pattern of elements for use on a semiconductor wafer, comprising:

choosing a first location of a number of edges of a number of conductive elements, the location of the number of edges defining at least one space between elements;

selecting spaces that possess space dimensions within a range, the range including a minimum dimension and a maximum dimension;

choosing a desired space dimension based on characteristics of the pattern of elements adjacent to selected spaces; and modifying the first location of at least a portion of one of the number of edges to a second location wherein the space dimension is modified to the desired space dimension.

2. The method of claim 1, wherein a space dimension greater than or equal to the minimum dimension cannot be planarized in a subsequent single fill operation.

3. The method of claim 1, wherein a space dimension greater than the maximum dimension includes enough space to fit a supplemental element in the space, the supplemental element being spaced apart from adjacent elements by the desired space dimension.

4. The method of claim 1, wherein the desired space dimension includes a first space dimension that is chosen when adjacent elements are larger than a threshold dimension.

5. The method of claim 1, wherein the desired space dimension includes a second space dimension that is chosen when adjacent elements are less than or equal to a threshold dimension.

6. The method of claim 5, wherein the second space dimension includes a minimum lithographic feature size.

7. A method of forming a pattern of elements for use on a semiconductor wafer, comprising:

choosing a first location of a number of edges of a number of conductive elements, the location of the number of edges defining at least one space between elements;

selecting spaces that possess space dimensions within a range, the range including a minimum dimension and a maximum dimension;

subdividing the selected spaces into a number of sub-spaces, wherein the sub-spaces include more simple polygons;

choosing a desired space dimension of each sub-space based on characteristics of the pattern of elements adjacent to each sub-spaces; and modifying the first location of at least a portion of one of the number of edges adjacent to each sub-space to a second location wherein the space dimension is modified to the desired space dimension.

8. The method of claim 7, wherein subdividing the selected spaces into a number of sub-spaces includes subdividing the selected spaces into a number of rectangles.

9. The method of claim 7, wherein subdividing the selected spaces into a number of sub-spaces includes subdividing the selected spaces into a number of rectangles by fracturing the selected spaces along an X-direction.

10. The method of claim 7, wherein subdividing the selected spaces into a number of sub-spaces includes subdividing the selected spaces into a number of rectangles by fracturing the selected spaces along a Y-direction.

11. The method of claim 7, wherein subdividing the selected spaces into a number of sub-spaces includes subdividing the selected spaces into a number of rectangles by fracturing the selected spaces along a first direction and a second direction, wherein fracturing and modification of the first location of the number of edges is performed iteratively until substantially all space dimensions include the desired space dimension.

12. A method of forming a reticle, comprising:

choosing a first location of a number of edges of a number of conductive elements, the location of the number of edges defining at least one space between elements;

selecting spaces that possess space dimensions within a range, the range including a minimum dimension and a maximum dimension:

choosing a desired space dimension based on characteristics of the pattern of elements adjacent to selected spaces;

modifying the first location of at least a portion of one of the number of edges to a second location wherein the space dimension is modified to the desired space dimension; and printing a pattern of elements on a reticle substrate wherein modified edges are located at the second locations.

13. The method of claim 12, wherein the reticle substrate includes a photolithography substrate that allows passage of a percentage of light.

14. The method of claim 12, wherein a space dimension greater than or equal to the minimum dimension cannot be planarized in a subsequent single fill operation.

15. The method of claim 12, wherein a space dimension greater than the maximum dimension includes enough space to fit a supplemental element in the space, the supplemental element being spaced apart from adjacent elements by the desired space dimension.

16. The method of claim 12, wherein the desired space dimension includes a first space dimension that is chosen when adjacent elements are larger than a threshold dimension.

17. The method of claim 12, wherein the desired space dimension includes a second space dimension that is chosen when adjacent elements are less than or equal to a threshold dimension.

18. The method of claim 17, wherein the second space dimension includes a minimum lithographic feature size.

19. A method of forming a pattern of elements on a semiconductor surface, comprising:

choosing a first location of a number of edges of a number of elements, the location of the number of edges defining at least one space between elements;

selecting spaces that possess space dimensions within a range, the range including a minimum dimension and a maximum dimension;

choosing a desired space dimension based on characteristics of the pattern of elements adjacent to selected spaces;

modifying the first location of at least a portion of one of the number of edges to a second location wherein the space dimension is modified to the desired space dimension;

printing a pattern of elements on a reticle substrate wherein modified edges are located at the second locations;

utilizing the reticle to print a mask pattern on a semiconductor surface; and forming the pattern of elements on the semiconductor surface in regions exposed by the mask pattern.

20. The method of claim 19, wherein the mask pattern includes a photo reactive resist material.

21. The method of claim 19, wherein forming the pattern of elements includes forming a pattern of conductive elements.

22. The method of claim 19, wherein forming the pattern of conductive elements includes forming a pattern of metal elements.

23. A method of forming a pattern of elements for use on a semiconductor wafer, comprising:
choosing a first location of a number of edges of a number of conductive elements, the location of the number of edges defining at least one space between elements;
selecting spaces that possess space dimensions within a range, the range including a minimum dimension and a maximum dimension;
choosing a desired space dimension based on characteristics of the pattern of elements adjacent to selected spaces;
classifying the number of edges of the conductive elements; and
modifying the first location of at least a portion of some of the number of edges to a second location based on the classification of the number of edges wherein the space dimension is modified to the desired space dimension.

24. The method of claim 23, wherein classifying the number of edges of the conductive elements includes classification of each edge as one of a group consisting of inside edges, corner edges, and straddling edges.

25. The method of claim 23, wherein classifying the number of edges of the conductive elements includes ranking inside edges first, corner edges second, and straddling edges third.

26. A method of forming a pattern of elements for use on a semiconductor wafer, comprising:
choosing a first location of a number of edges of a number of conductive elements, the location of the number of edges defining at least one space between elements;
selecting TODO spaces that possess space dimensions within a range, the range including a minimum dimension and a maximum dimension;
choosing a desired space dimension based on characteristics of the pattern of elements adjacent to selected spaces;
modifying the first location of at least a portion of one of the number of edges adjacent to one of the TODO spaces to a second location wherein the space dimension is modified to the desired space dimension;
selecting FLOAT spaces that possess space dimensions larger than the maximum dimension; and
plotting a location of at least one floating element within the FLOAT spaces.

27. The method of claim 26, wherein the steps are performed in an order presented.

28. The method of claim 26, wherein a space dimension greater than or equal to the minimum dimension cannot be planarized in a subsequent single fill operation.

29. The method of claim 26, wherein a space dimension greater than the maximum dimension includes enough space to fit a supplemental element in the space, the supplemental element being spaced apart from adjacent elements by the desired space dimension.

30. The method of claim 26, wherein the desired space dimension includes a first space dimension that is chosen when adjacent elements are larger than a threshold dimension.

31. The method of claim 26, wherein the desired space dimension includes a second space dimension that is chosen when adjacent elements are less than or equal to a threshold dimension.

32. The method of claim 31, wherein the second space dimension includes a minimum lithographic feature size.

33. A machine-readable medium with instructions stored thereon, the instructions when executed operable to cause:
selection of a first location of a number of edges of a number of conductive elements, the location of the number of edges defining at least one space between elements;
selection of spaces that possess space dimensions within a range, the range including a minimum dimension and a maximum dimension;
selection of a desired space dimension based on characteristics of the pattern of elements adjacent to selected spaces; and
modification of the first location of at least a portion of one of the number of edges to a second location wherein the space dimension is modified to the desired space dimension.

34. The machine-readable medium of claim 33, wherein a space dimension greater than or equal to the minimum dimension cannot be planarized in a subsequent single fill operation.

35. The machine-readable medium of claim 33, wherein a space dimension greater than the maximum dimension includes enough space to fit a supplemental element in the space, the supplemental element being spaced apart from adjacent elements by the desired space dimension.

36. The machine-readable medium of claim 33, wherein the desired space dimension includes a first space dimension that is chosen when adjacent elements are larger than a threshold dimension.

37. The machine-readable medium of claim 33, wherein the desired space dimension includes a second space dimension that is chosen when adjacent elements are less than or equal to a threshold dimension.

38. The machine-readable medium of claim 37, wherein the second space dimension includes a minimum lithographic feature size.

39. A machine-readable medium with instructions stored thereon, the instructions when executed operable to cause:
selection of a first location of a number of edges of a number of conductive elements, the location of the number of edges defining at least one space between elements;
selection of spaces that possess space dimensions within a range, the range including a minimum dimension and a maximum dimension;
selection of a desired space dimension based on characteristics of the pattern of elements adjacent to selected spaces;
classification of the number of edges of the conductive elements; and
modification of the first location of at least a portion of some of the number of edges to a second location based on the classification of the number of edges wherein the space dimension is modified to the desired space dimension.

40. The machine-readable medium of claim 39, wherein a space dimension greater than or equal to the minimum dimension cannot be planarized in a subsequent single fill operation.

41. The machine-readable medium of claim 39, wherein a space dimension greater than the maximum dimension includes enough space to fit a supplemental element in the space, the supplemental element being spaced apart from adjacent elements by the desired space dimension.

42. The machine-readable medium of claim 39, wherein the desired space dimension includes a first space dimension that is chosen when adjacent elements are larger than a threshold dimension.

43. The machine-readable medium of claim 39, wherein the desired space dimension includes a second space dimension that is chosen when adjacent elements are less than or equal to a threshold dimension.

44. The machine-readable medium of claim 43, wherein the second space dimension includes a minimum lithographic feature size.

45. The method of claim 39, wherein classification of the number of edges of the conductive elements includes classification of each edge as one of a group consisting of inside edges, corner edges, and straddling edges.

46. The method of claim 45, wherein classification of the number of edges of the conductive elements includes ranking inside edges first, corner edges second, and straddling edges third.

47. A machine-readable medium with instructions stored thereon, the instructions when executed operable to cause:
   selection of a first location of a number of edges of a number of conductive elements, the location of the number of edges defining at least one space between elements;
   selection of TODO spaces that possess space dimensions within a range, the range including a minimum dimension and a maximum dimension;
   selection of a desired space dimension based on characteristics of the pattern of elements adjacent to selected spaces;
   modification of the first location of at least a portion of one of the number of edges adjacent to one of the TODO spaces to a second location wherein the space dimension is modified to the desired space dimension;
   selection of FLOAT spaces that possess space dimensions larger than the maximum dimension; and
   selection of a location of at least one floating element within the FLOAT spaces, wherein the floating element is separated from adjacent elements by the desired space dimension.

48. The machine-readable medium of claim 47, wherein the steps are performed in an order presented.

49. The machine-readable medium of claim 47, wherein a space dimension greater than or equal to the minimum dimension cannot be planarized in a subsequent single fill operation.

50. The machine-readable medium of claim 47, wherein a space dimension greater than the maximum dimension includes enough space to fit a supplemental element in the space, the supplemental element being spaced apart from adjacent elements by the desired space dimension.

51. The machine-readable medium of claim 47, wherein the desired space dimension includes a first space dimension that is chosen when adjacent elements are larger than a threshold dimension.

52. The machine-readable medium of claim 47, wherein the desired space dimension includes a second space dimension that is chosen when adjacent elements are less than or equal to a threshold dimension.

53. The machine-readable medium of claim 52, wherein the second space dimension includes a minimum lithographic feature size.

54. A pattern generating system, comprising:
   a processor;
   a memory, containing instructions thereon, the instructions when executed operable to cause:
      selection of a first location of a number of edges of a number of conductive elements, the location of the number of edges defining at least one space between elements;
      selection of spaces that possess space dimensions within a range, the range including a minimum dimension and a maximum dimension;
      selection of a desired space dimension based on characteristics of the pattern of elements adjacent to selected spaces; and
      modification of the first location of at least a portion of one of the number of edges to a second location wherein the space dimension is modified to the desired space dimension.

55. The pattern generating system of claim 54, wherein a space dimension greater than or equal to the minimum dimension cannot be planarized in a subsequent single fill operation.

56. The pattern generating system of claim 54, wherein a space dimension greater than the maximum dimension includes enough space to fit a supplemental element in the space, the supplemental element being spaced apart from adjacent elements by the desired space dimension.

57. The pattern generating system of claim 54, wherein the desired space dimension includes a first space dimension that is chosen when adjacent elements are larger than a threshold dimension.

58. The pattern generating system of claim 54, wherein the desired space dimension includes a second space dimension that is chosen when adjacent elements are less than or equal to a threshold dimension.

59. The pattern generating system of claim 58, wherein the second space dimension includes a minimum lithographic feature size.

\* \* \* \* \*

UNITED STATES PATENT AND TRADEMARK OFFICE
CERTIFICATE OF CORRECTION

PATENT NO. : 6,898,779 B2
DATED : May 24, 2005
INVENTOR(S) : Werner Juengling

It is certified that error appears in the above-identified patent and that said Letters Patent is hereby corrected as shown below:

<u>Column 14,</u>
Line 7, delete "dimension:" and insert -- dimension; --, therefor.

Signed and Sealed this

Thirtieth Day of August, 2005

JON W. DUDAS
*Director of the United States Patent and Trademark Office*